United States Patent
Kim (10) Patent No.: US 7,534,035 B2
(45) Date of Patent: May 19, 2009

(54) TEMPERATURE SENSOR FOR GENERATING SECTIONAL TEMPERATURE CODE AND SECTIONAL TEMPERATURE DETECTION METHOD

(75) Inventor: Chan-Kyung Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 228 days.

(21) Appl. No.: 11/566,664

(22) Filed: Dec. 4, 2006

(65) Prior Publication Data
US 2007/0160114 A1    Jul. 12, 2007

(30) Foreign Application Priority Data
Jan. 11, 2006   (KR) ............... 10-2006-0003098

(51) Int. Cl.
*G01K 7/01*  (2006.01)
(52) U.S. Cl. .................. 374/178; 374/E7.035
(58) Field of Classification Search ............ 374/178, 374/100, 170
See application file for complete search history.

(56) References Cited

U.S. PATENT DOCUMENTS

| | | | |
|---|---|---|---|
| 6,600,331 B2 * | 7/2003 | Kilian et al. ............... | 324/760 |
| 6,726,361 B2 | 4/2004 | Bisping et al. | |
| 6,937,087 B2 | 8/2005 | Sim et al. | |
| 7,078,955 B2 * | 7/2006 | Kim et al. ................... | 327/512 |
| 7,107,178 B2 | 9/2006 | Won et al. | |
| 2005/0062482 A1 | 3/2005 | Vincent et al. | |

FOREIGN PATENT DOCUMENTS

| | | |
|---|---|---|
| DE | 10126300 C1 | 5/2001 |
| DE | 10133736 A1 | 7/2001 |
| DE | 102004049252 | 5/2005 |
| DE | 10336294 | 9/2005 |
| JP | 2002-215258 | 7/2002 |
| KR | 2005-0003893 | 1/2005 |
| KR | 2005-0062842 | 6/2005 |

OTHER PUBLICATIONS

English language abstract for Korean Publication No. 2005-0003893.
English language abstract for Korean Publication No. 2005-0062842.
English language abstract for Japanese Publication No. 2002-215258.

* cited by examiner

*Primary Examiner*—Andre J Allen
(74) *Attorney, Agent, or Firm*—Marger Johnson & McCollom, P.C.

(57) ABSTRACT

Provided are a temperature sensor for generating a sectional temperature code and sectional temperature detection method. In one embodiment, the temperature sensor includes a plurality of serially connected fixed delay cells inputting a temperature detection signal and delaying the temperature detection signal, a variable delay cell inputting the temperature detection signal and delaying the temperature detection signal; and a sectional discrimination logic unit latching outputs of the fixed delay cells in response to the variable delay cells and generating the sectional temperature code. The sectional discrimination logic unit discriminates the sectional temperatures based on temperatures where an output of the variable delay cell meets each of outputs of the fixed delay cells according to the change in the temperature, and generates temperature codes corresponding to the sectional temperatures.

20 Claims, 9 Drawing Sheets

TEMPERATURE SENSOR FOR GENERATING SECTIONAL TEMPERATURE CODE AND SECTIONAL TEMPERATURE DETECTION METHOD

This application claims the priority of Korean Patent Application No. 10-2006-0003098, filed on Jan. 11, 2006, in the Korean Intellectual Property Office, the disclosure of which is incorporated herein in its entirety by reference.

BACKGROUND

1. Field of the Invention

The present invention relates to a semiconductor integrated circuit, and more particularly, to a temperature sensor for generating a sectional temperature code and sectional temperature detection method.

2. Description of the Related Art

Figure 1:
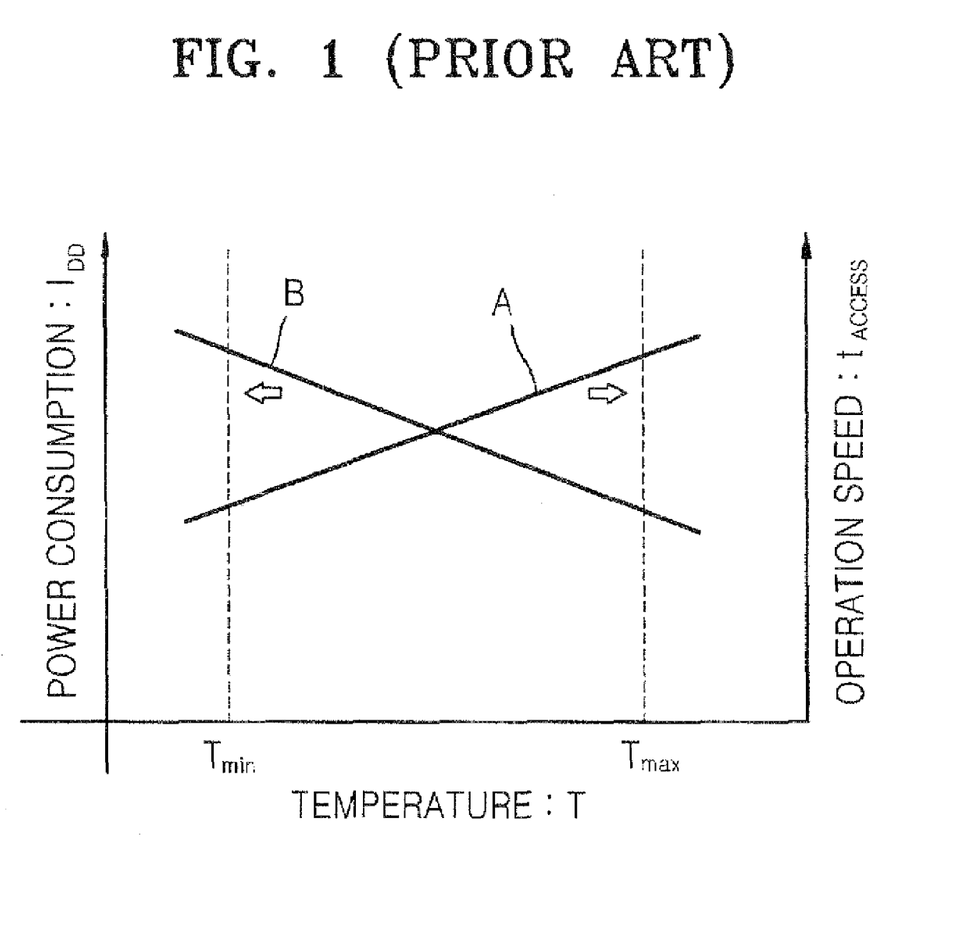
FIG. 1 is a graph of temperature characteristics of a semiconductor device.

Semiconductor devices have temperature characteristics in terms of operations. Typical operational characteristics of semiconductor devices are a consumption current IDD and operation speed tACCESS. FIG. 1 is a graph of temperature characteristics of a semiconductor device. Referring to FIG. 1, as the temperature increases, the operation speed increases (A), and the amount of the consumption current IDD decreases (B).

These temperature characteristics are of great importance to volatile memory devices such as dynamic random access memory (DRAMs). Since DRAM cells have an increase in the amount of leakage current as temperature rises, data maintenance abilities can be deteriorated due to charges, which reduce data maintenance time. To address this issue, DRAMs require a faster refresh operation. That is, it is necessary to provide a method of changing the refresh period of DRAMs according to temperatures because of the effect on data maintenance capabilities higher temperature changes has. To this end, a temperature sensor is required to sense the temperature inside DRAMs.

Figure 2:
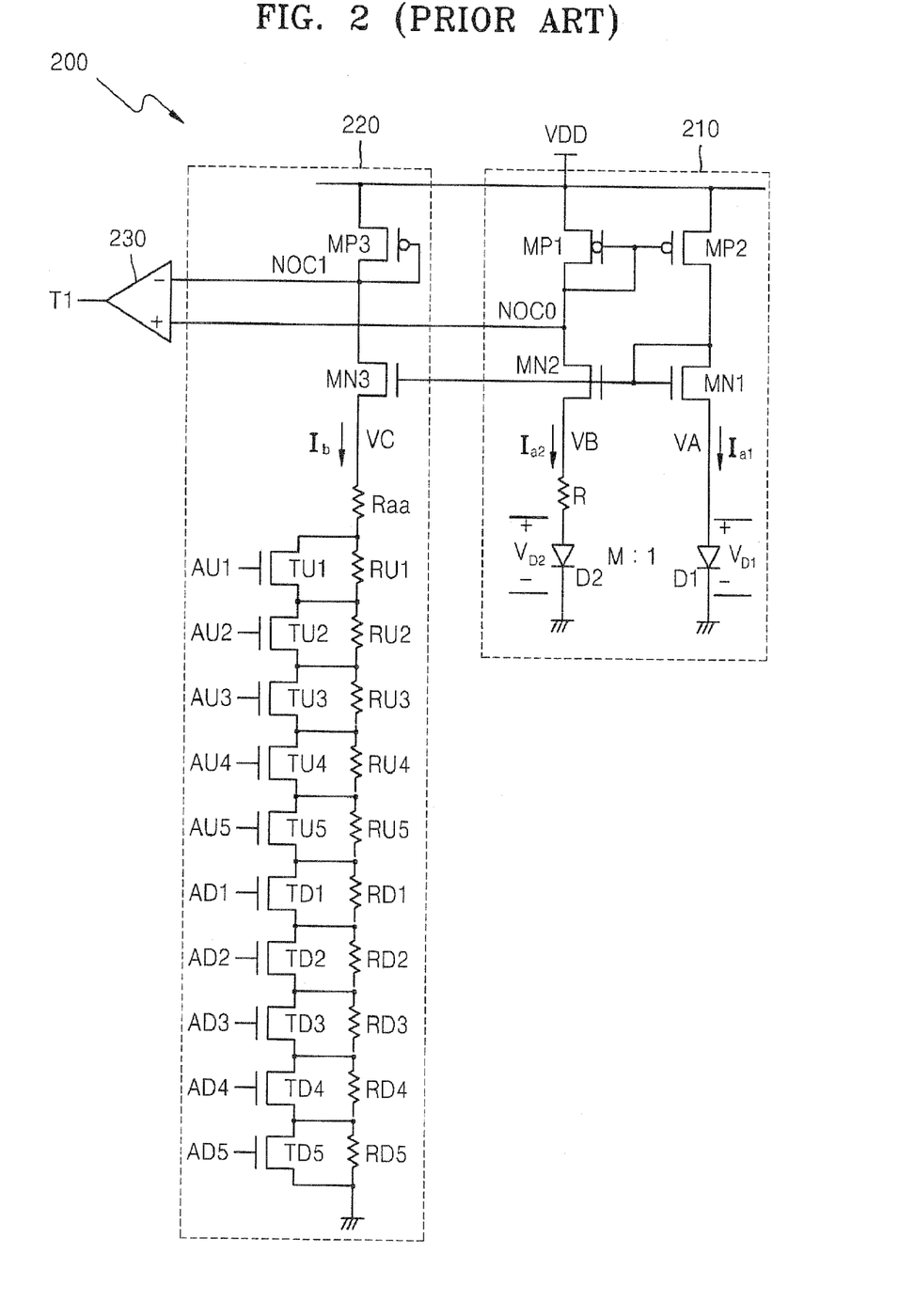
FIG. 2 is a circuit diagram of a conventional temperature sensor.

FIG. 2 is a circuit diagram of a conventional temperature sensor. Referring to FIG. 2, the temperature sensor 200 comprises a proportional to absolute temperature (PTAT) current generator 210, a complementary to absolute temperature (CTAT) current generator 220, and a comparator 230.

The PTAT current generator 210 comprises first and second PMOS transistors MP1 and MP2, first and second NMOS transistors MN1 and MN2, a resistor R, and first and second diodes D1 and D2. The first and second PMOS transistors MP1 and MP2 have the same size and include a first current mirror. The first and second NMOS transistors MN1 and MN2 have the same size and include a second current mirror. The size of the first and second diodes D1 and D2 has a ratio of 1:M.

Since the first current mirror of the first and second PMOS transistors MP1 and MP2 and the second current mirror of the first and second NMOS transistors MN1 and MN2 are symmetrical, amounts of currents $Ia_1$ and $Ia_2$ are identical to each other. That is, $Ia_1 : Ia_2 = 1:1$.

A turned-on current ID of a general diode is indicated below, $$ID = Is^*(e^{VD/VT}) = Is^*(e^{VD/VT}) \quad (1)$$

wherein, Is denotes a contrary directional saturized current of the diode, VD denotes a diode voltage, and VT is a temperature voltage indicated as kT/q. Therefore, the current $Ia_1$ flows through the first diode D1 as indicated below, $$Ia1 = Is^*(e^{VD1/VT}) \quad (2)$$

A first diode voltage VD1 is $$VD1 = VT^* \ln(Ia1/Is) \quad (3)$$

A second diode voltage VD2 is $$VD2 = VT^* \ln(Ia2/(Is^*M)) \quad (4)$$

Since the amounts of the currents $Ia_1$ and $Ia_2$ are identical to each other, the first diode voltage VD1 is almost the same as a present temperature voltage NOC0. Therefore, $$V(NOC0) = VD1 = VD2 + Ia2^*R \quad (5)$$

If equations 3 and 4 are substituted for equation 5, $$VT^* \ln(Ia1/Is) = VT^* \ln(Ia2/(Is^*M)) + Ia2^*R \quad (6)$$

Therefore, the current $Ia_2$ is $$Ia2 = VT^* \ln(M)/R \quad (7)$$

Thus, the current $Ia_1$ is proportional to a temperature. That is, the PTAT current generator 210 generates the current $Ia_1$ proportional to a current temperature.

The CTAT current generator 220 comprises a third PMOS transistor MP3, a third NMOS transistor MN3, a plurality of resistors Raa, RU1~RU5, and RD1~RD5, and a plurality of switching transistors TU1~TU5 and TD1~TD5.

The third NMOS transistor MN3 connects to first and second NMOS transistors MN1 and MN2 and a current mirror. An amount of a current Ib is almost identical to the amounts of the currents $Ia_1$ and $Ia_2$. The switching transistors TU1~TU5 and TD1~TD5 are selectively turned on/off in response to trip temperature control signals AU1~AU5 and AD1~AD5, so that the resistors RU1~RU5, and RD1~RD5 connected to the turned-on switching transistors TU1~TU5 and TD1~TD5 are selectively short-circuited.

If the amounts of the currents Ib, $Ia_1$, and $Ia_2$ are almost identical to one another, VA and VB node voltages of the PTAT current generator 210 are almost the same as a VC node voltage of the CTAT current generator 220. In equations 3 and 4, a VT voltage increases as the temperature increases; however, an amount of the current Is increases greater than the amount of the VT voltage. A diode voltage is reduced as the temperature decreases. Therefore, an amount of the current Ib that flows through the resistors Raa, RU1~RU5, and RD1~RD5 is reduced as the temperature increases. That is, the current generated by the CTAT current generator 220 is in inverse proportional to the temperature.

Figure 3:
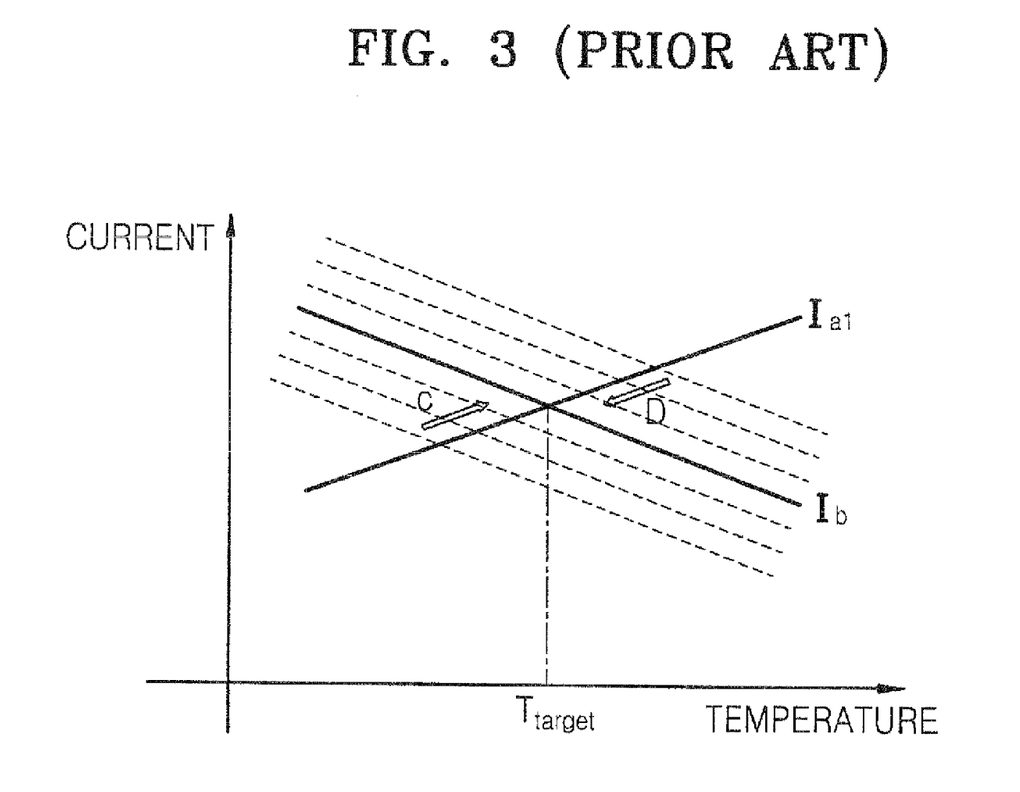
FIG. 3 is a graph of explaining a temperature detection method using the temperature sensor Illustrated in FIG. 2.

The comparator 230 compares the present temperature voltage NOC0 and a sensed temperature voltage NOC1. The present temperature voltage NOC0 and a sensed temperature voltage NOC1 are determined using the current $Ia_1$ and the current Ib, respectively. The temperature sensor 200 detects a present temperature at a point where the amount of the currents $Ia_1$ and Ib are identical to each other as illustrated in FIG. 3. FIG. 3 is a graph explaining the temperature detection method using the temperature sensor illustrated in FIG. 2.

Referring to FIG. 3, the current $Ia_1$ is proportional to the temperature, whereas the current Ib is in inverse proportional to the temperature. For example, when a present temperature of a chip including the temperature sensor 200 is 45° C. If the amount of the Ib current is less than the amount of the current $Ia_1$, the trip temperature signals AU1~AU5 and AD1~AD5 of the CTAT current generator 220 are selectively enabled to control a resistance value of the CTAT current generator 220 and to flow a great amount of the current Ib (C), so that the amounts of the currents Ib and $Ia_1$ are substantially identical to each other.

To the contrary, if the amount of the Ib current is greater than the amount of the current $Ia_1$, the trip temperature signals AU1~AU5 and AD1~AD5 of the CTAT current generator 220 are selectively disabled to control the resistance value of the CTAT current generator 220 and to flow a small amount of the current Ib (D), so that the amounts of the currents Ib and Ia$_1$ are identical to each other. If the amounts of the currents Ib and Ia$_1$ are identical to each other, the temperature sensor 200 senses the present temperature of the chip, i.e. 45° C.

However, the temperature sensor 200 uses a bipolar transistor of an NPN transistor or a PNP transistor in order to realize the first and second diodes D1 and D2. The NPN transistor or the PNP transistor have analog operational characteristics, where the temperature sensor 200 may sense a nonlinear change in the temperature of the chip. Also, because both the NPN transistor and the PNP transistors are large, their inclusion increases the area of the chip.

SUMMARY

The present invention provides a temperature sensor for generating a sectional temperature code and a sectional temperature detection method.

According to an embodiment of the present invention, a temperature sensor for generating a sectional temperature code may include a plurality of serially connected fixed delay cells inputting a temperature detection signal and delaying the temperature detection signal, a variable delay cell inputting the temperature detection signal and delaying the temperature detection signal, and a sectional discrimination logic unit latching outputs of the fixed delay cells in response to the variable delay cells and generating the sectional temperature code.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Like reference numerals in the drawings denote like elements, and thus their description will be omitted.

Figure 4:
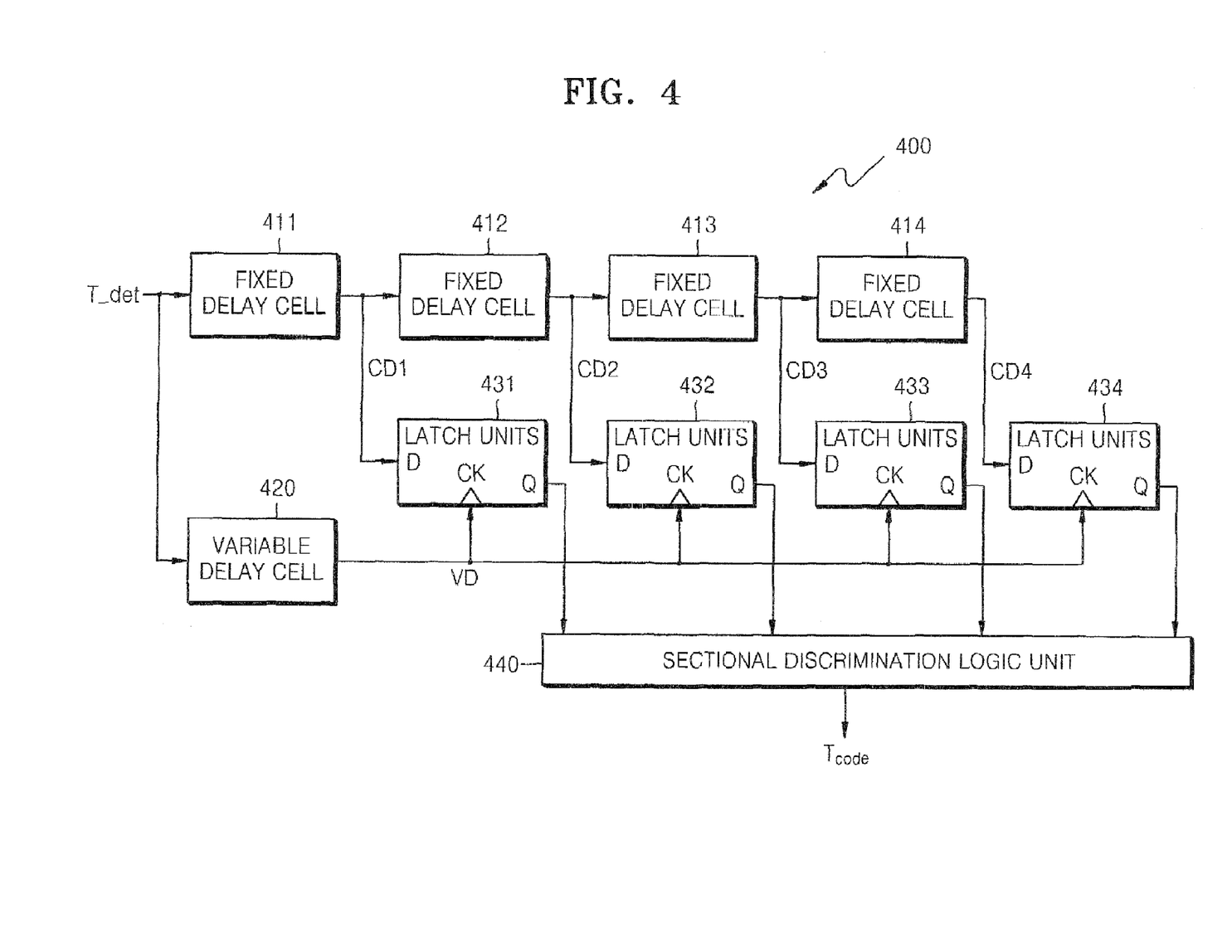
FIG. 4 is a block diagram of a temperature sensor according to an embodiment of the present invention.

FIG. 4 is a block diagram of a temperature sensor 400 according to an embodiment of the present invention. Referring to FIG. 4, the temperature sensor 400 includes fixed delay cells 411, 412, 413, and 414, a variable delay cell 420, latch units 431, 432, 433, and 434, and a sectional discrimination logic unit 440.

Figure 5:
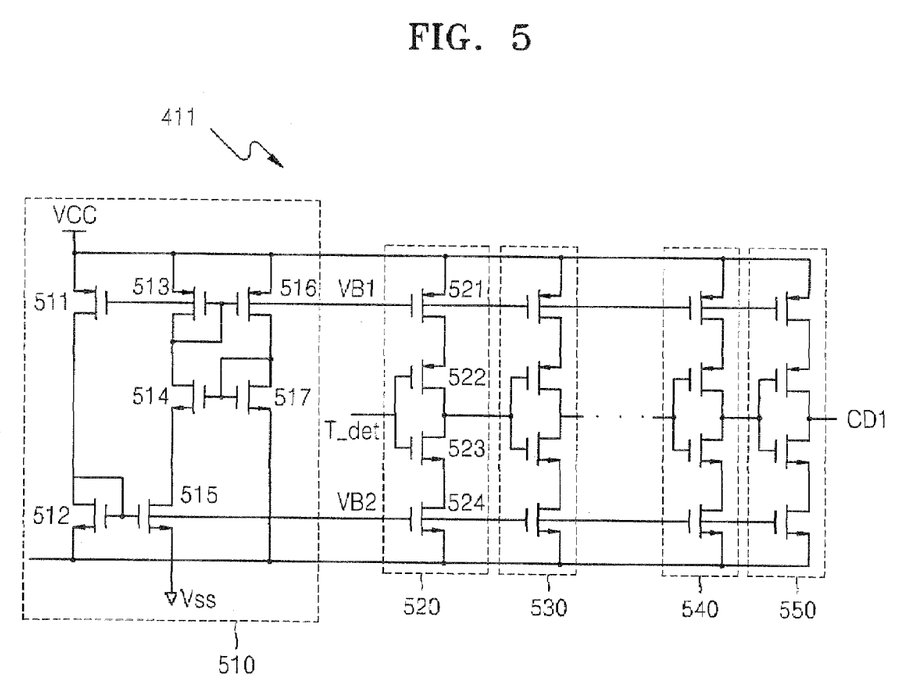
FIG. 5 is a circuit diagram of the first fixed delay cell illustrated in FIG. 4.

FIG. 5 is a circuit diagram of the first fixed delay cell 411 illustrated in FIG. 4. Referring to FIG. 5, the first fixed delay cell 411 comprises a first bias unit 510 and a plurality of delay terminals 520, 530, 540, and 550 that input a temperature detection signal T_det.

The first bias unit 510 includes a first PMOS transistor 511 and a first NMOS transistor 512 serially connected between a power voltage Vcc and a ground voltage Vss. A gate and drain of the first NMOS transistor 512 are interconnected to generate a second bias signal VB2.

The first bias unit 510 further includes a second PMOS transistor 513 and second and third NMOS transistors 514 and 515 serially connected between the power voltage Vcc and the ground voltage Vss. A gate and drain of the second PMOS transistor 513 are interconnected, and the gate of the second PMOS transistor 513 is connected a gate of the first PMOS transistor 511 to generate a first bias signal VB1. A gate of the third NMOS transistor 515 is connected to the gate of the first NMOS transistor 512.

The first bias unit 510 further includes a third PMOS transistor 516 and fourth NMOS transistors 517 serially connected between the power voltage Vcc and the ground voltage Vss. The gate of the third PMOS transistor 516 is connected to a gate of the first PMOS transistor 511. A gate and drain of the fourth NMOS transistors 517 are interconnected.

In the first bias unit 510, the first, second and third PMOS transistors 511, 513, and 516 include a current mirror, the first and third NMOS transistor 512 and 515 include another current mirror, and the second and fourth NMOS transistors 514 and 517 include another current mirror. Therefore, the first bias unit 510 has a fixed amount of current that flows through the current mirrors in response to a change in the temperature.

The delay terminals 520, 530, 540, and 550 are serially connected and receive an input of the temperature detection signal T_det. In response to this input, the delay terminals 520, 530, 540, and 559 generate a first fixed delay signal CDI.

The first delay terminal 520 includes first and second PMOS transistors 521 and 522 and first and second NMOS transistors 523 and 524 serially connected between the power voltage Vcc and the ground voltage Vss. A gate of the first PMOS transistor 521 is connected to the first bias signal VB1 and a gate of the second NMOS transistor 524 is connected to the second bias signal VB2. Gates of the second PMOS transistor 522 and the first NMOS transistor 523 are connected to the temperature detection signal T_det. Drains of the second PMOS transistor 522 and the first NMOS transistor 523 are output terminals of the first delay terminal 520. The output of the first delay terminal is connected to an input of the second delay terminal 530.

The other delay terminals 530, 540, and 550 have the same constitution as the first delay terminal 520. Further, the first PMOS transistors 521 of the delay terminals 520, 530, 540, and 550 operate together with the second PMOS transistor 513 of the first bias unit 510 as a current mirror. In addition, the second NMOS transistors 524 of each of the delay terminals 520, 530, 540, and 550 operate together with the first NMOS transistor 512 of the first bias unit 510 as a current mirror.

Since each of the delay terminals 520, 530, 540, and 550 operates with the first bias unit 510 as current mirrors, a fixed current flows through each of the delay terminals 520, 530, 540, and 550 regardless of the change in the temperature. Therefore, while each of the delay terminals 520, 530, 540, and 550 has a fixed delay time that do not depend on changes in temperatures. Therefore, the first fixed delay signal CD1 has a fixed period regardless of a change in the temperature.

Figure 6:
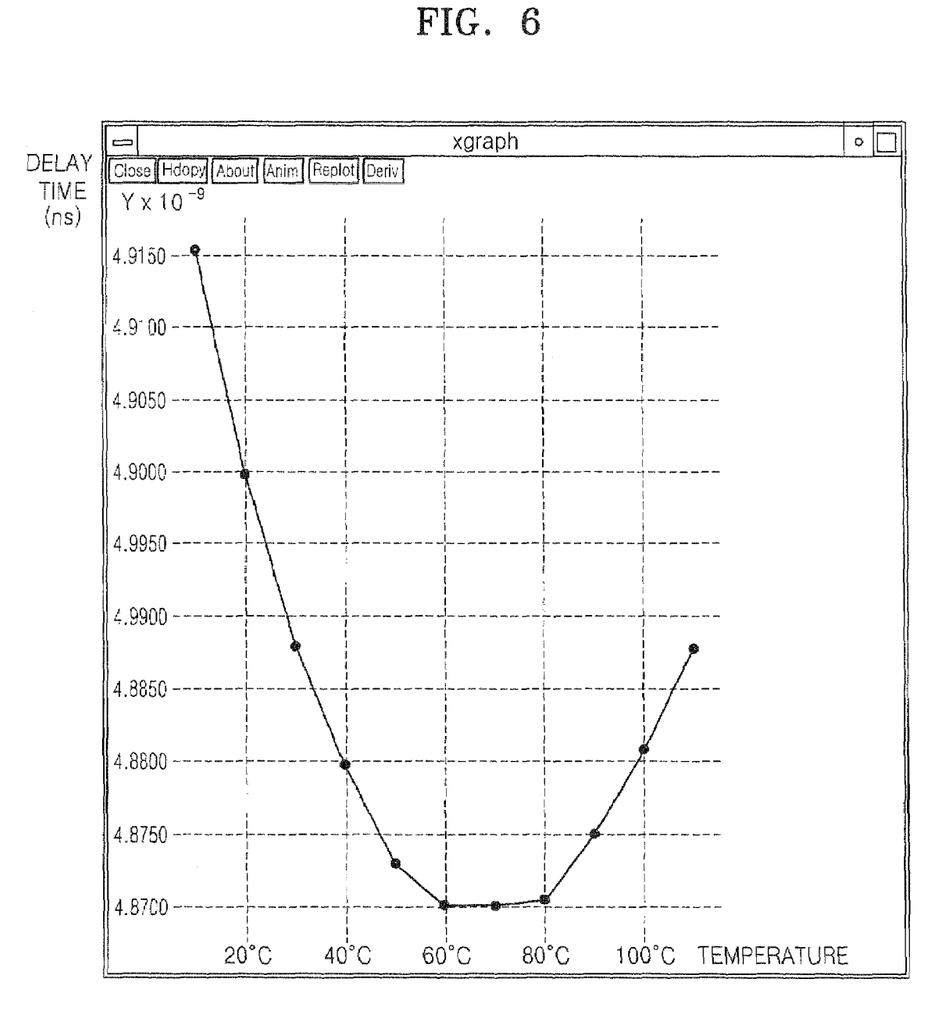
FIG. 6 is a graph of a simulation of the first fixed delay cell illustrated in FIG. 5.

FIG. 6 is a graph of a simulation of the first fixed delay cell 411. Referring to FIG. 6, the first fixed delay signal CD1 has a change in a delay time of several ns according to the temperature. The first fixed delay signal CD1 has a fixed change in the delay time compared to a change in the delay time of several ns of the variable delay cell 420.

Figure 7:
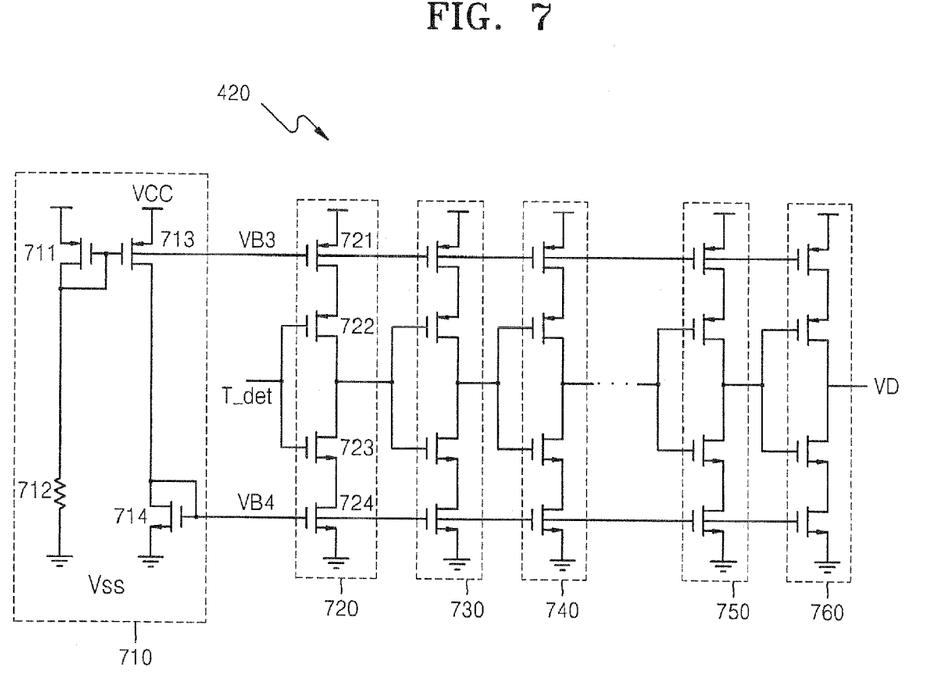
FIG. 7 is a circuit diagram of the variable delay cell illustrated in FIG. 4.

FIG. 7 is a circuit diagram of the variable delay cell 420 illustrated in FIG. 4. Referring to FIG. 7, the variable delay cell 420 includes a second bias unit 710 and a plurality of delay terminals 720, 730, 740, 750, and 760.

The second bias unit 710 includes a first PMOS transistor 711 and a resistor 712 serially connected between a power voltage Vcc and a ground voltage Vss. A gate and drain of the first PMOS transistor 711 are interconnected. The second bias unit 710 further includes a second PMOS transistor 713 and an NMOS transistor 714 serially connected between the power voltage Vcc and the ground voltage Vss. A gate of the second PMOS transistor 713 is connected to the gate of the first PMOS transistor 711, and the first and second PMOS transistors 711 and 713 operate as a current mirror. The gate and drain of the NMOS transistor 714 are interconnected. The gate of the first PMOS transistor 711 is connected to a third bias signal VB3 and the gate of the NMOS transistor 714 is connected to a fourth bias signal VB4.

In the second bias unit 710, the resistance value of the resistor 712 is increased as a temperature increases so that an amount of current of the first PMOS transistor 711 and the mirrored second PMOS transistor 713 is reduced, and an amount of current of the NMOS transistor 714 serially connected to the second PMOS transistor 713 is reduced.

Similarly, the resistance value of the resistor 712 is reduced as a temperature decreases so that an amount of current of the first PMOS transistor 711, the second PMOS transistor 713, and the NMOS transistor 714 is increased.

The delay terminals 720, 730, 740, 750, and 760 are serially connected, input the temperature detection signal T_det, and output a variable delay signal VD. Each of the delay terminals 720, 730, 740, 750, and 760 has the same constitution as each of the delay terminals 510, 520, 530, and 540 illustrated in FIG. 5. Therefore, further description details will be omitted.

The first PMOS transistor 721 of each of the delay terminals 720, 730, 740, 750, and 760 operates with the first PMOS transistor 711 of the second bias unit 710 as a current mirror. In addition, the second NMOS transistor 724 of each of the delay terminals 720, 730, 740, 750, and 760 operates with the NMOS transistor 714 of the second bias unit 710 as a current mirror.

The operation of the variable delay cell 420 will now be described.

As the temperature increases, the amount of current of the first PMOS transistor 711 and the NMOS transistor 714 of the second bias unit 710 is reduced, and an amount of current of the first PMOS transistor 721 and the second NMOS transistor 724 of the delay terminals is also reduced. Thus, the amount of current in each of the delay terminals 720, 730, 740, 750, and 760 is also reduced so that the operation speed is reduced; thereby increasing the delay time of each of the delay terminals 720, 730, 740, 750, and 760.

As the temperature decreases, the amount of current of the first PMOS transistor 711 and the NMOS transistor 714 of the second bias unit 710 is increased, and an amount of current of the first PMOS transistor 721 and the second NMOS transistor 724 of the delay terminals is also increased. Thus, the amount of current in each of the delay terminals 720, 730, 740, 750, and 760 is also increased so that the operation speed is increased, thereby reducing the delay time of each of the delay terminals 720, 730, 740, 750, and 760.

Figure 8:
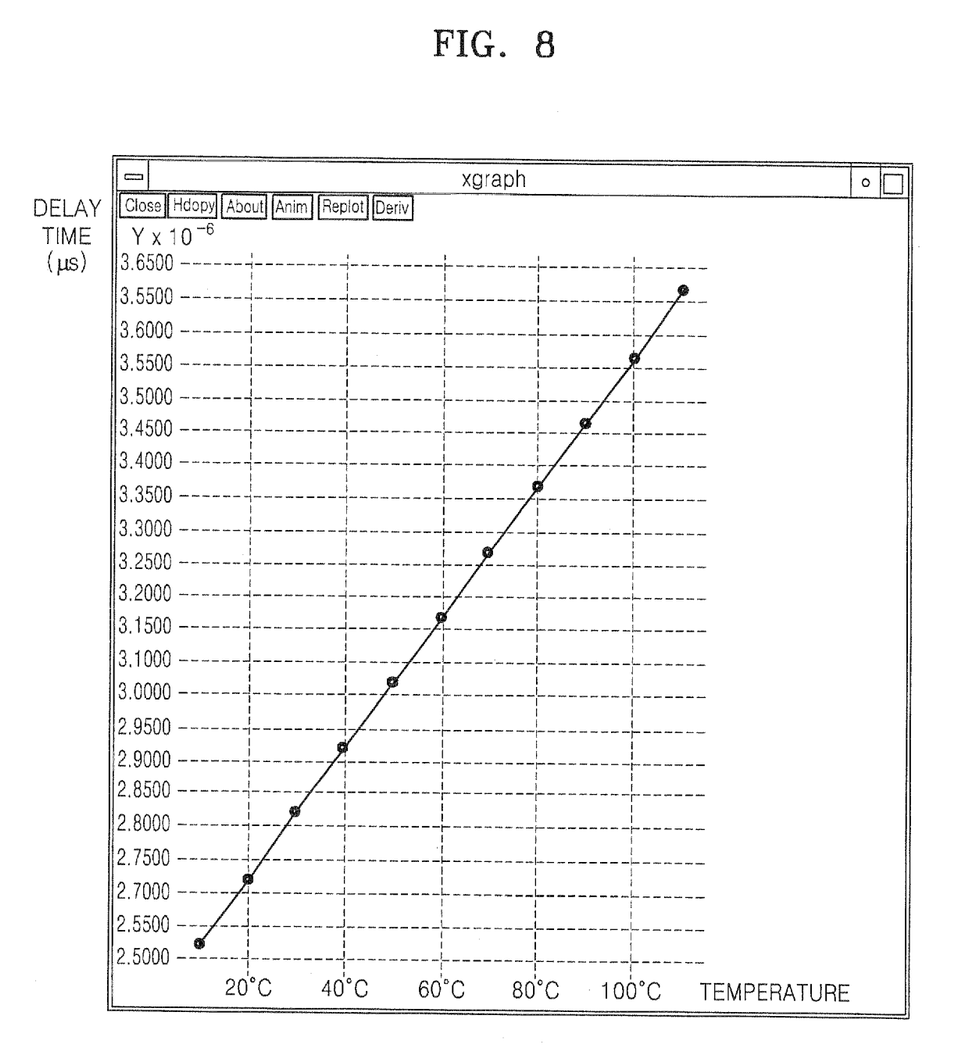
FIG. 8 is a graph of a simulation of the variable delay cell illustrated in FIG. 7.

FIG. 8 is a graph of a simulation of the variable delay cell 420 illustrated in FIG. 7. Referring to FIG. 8, the variable delay signal VD has a change in the delay time of several µs according to the temperature.

Referring again to FIG. 4, the plurality of latch units 431, 432, 433, and 434 latch first through fourth fixed delay signals CD1, CD2, CD3, and CD4, respectively, from the first through fourth fixed delay cells 411, 412, 413, and 414 in response to the variable delay signal VD. Each of the first through fourth latch units 431, 432, 433, and 434 can include a D-flipflop that inputs the variable delay signal VD as a clock signal CK, and the first through fourth fixed delay signals CD1, CD2, CD3, and CD4 as data D, respectively.

Figure 9:
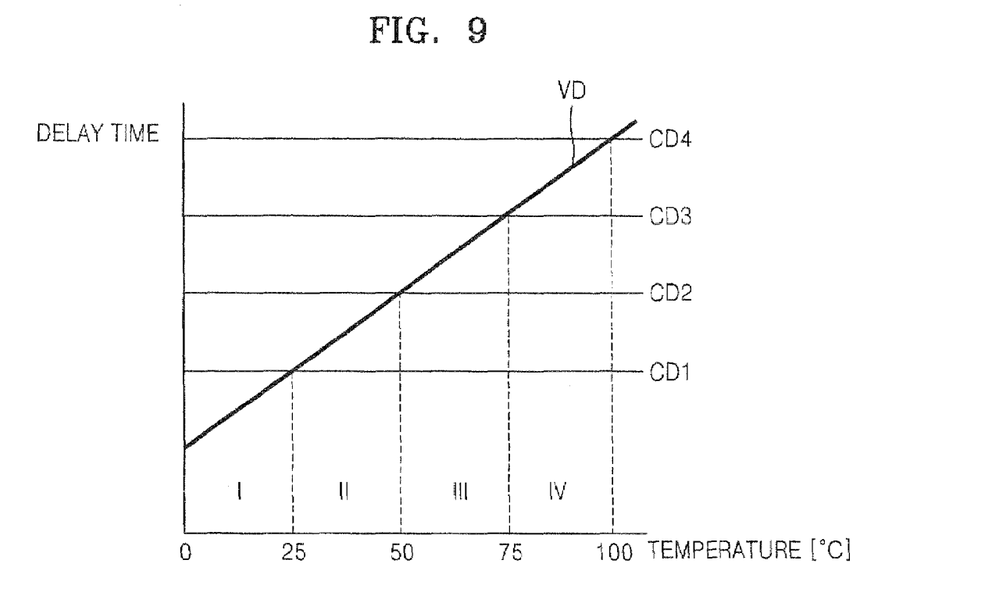
FIG. 9 is a graph of the sectional discrimination logic unit illustrated in FIG. 4.

FIG. 9 is a graph of the sectional discrimination logic unit 440 illustrated in FIG. 4. Referring to FIG. 9, outputs of the first through fourth latch units 431, 432, 433, and 434 are provided to the sectional discrimination logic unit 440. The sectional discrimination logic unit 440 establishes a temperature section between 0° C. through 25° C. as a first section I, a temperature section between 25° C. through 50° C. as a second section II, a temperature section between 50° C. through 75° C. as a third section III, and a temperature section between 75° C. through 1001C as a fourth section IV.

The graph shows that the temperature sections I through IV are divided according to four points where the variable delay signal VD meets each of the first through fourth fixed delay signals CD1, CD2, CD3, and CD4. Therefore, the sectional discrimination logic unit 440 latches the first through fourth fixed delay signals CD1, CD2, CD3, and CD4 in response to the variable delay signal VD to generate temperature code signals $T_{code}$. A temperature code signal of the first section I is indicated as "1000", a temperature code of the second section II is indicated as "1100", a temperature code of the third section III is indicated as "1110", and a temperature code of the fourth section IV is indicated as "1111".

Figure 10:
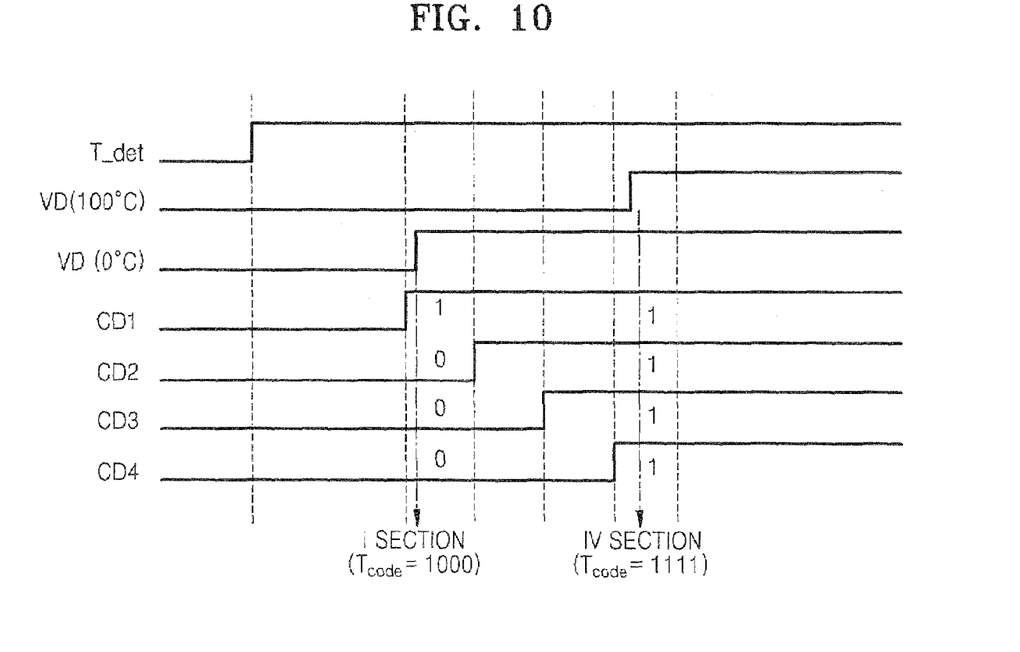
FIG. 10 is a timing diagram of the temperature sensor illustrated in FIG. 4.

FIG. 10 is a timing diagram of the temperature sensor 400 illustrated in FIG. 4. Referring to FIG. 10, the temperature detection signal T_det having a logic high is delayed to generate the first through fourth fixed delay signals CD1, CD2, CD3, and CD4 and the variable delay signal VD having the logic high. Since the variable delay signal VD changes its delay time according to a temperature, the variable delay signal VD is generated at 0° C. faster than the variable delay signal VD at 100° C. The first through fourth fixed delay signals CD1, CD2, CD3, and CD4 are generated after a fixed delay time regardless of a change in the temperature. Therefore, the temperature code signal $T_{code}$ is "1000" at 0° C. indicating that a present temperature of a chip is in the first section I. The temperature code signal $T_{code}$ is "1111" at 100° C. indicating that the present temperature of the chip is in the fourth section IV.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A temperature sensor for generating a sectional temperature code, comprising:
   a plurality of serially connected fixed delay cells receiving a temperature detection signal and delaying the temperature detection signal;
   a variable delay cell inputting the temperature detection signal and delaying the temperature detection signal; and
   a sectional discrimination logic unit latching outputs of the fixed delay cells in response to the variable delay cells and generating the sectional temperature code.

2. The temperature sensor of claim 1, wherein the fixed delay cells have a fixed delay time.

3. The temperature sensor of claim 2, wherein the fixed delay cells comprise:
   a first bias unit operated at a fixed amount of internal current regardless of the change in the temperature and outputting first and second bias signals; and
   a plurality of serially connected delay terminals inputting the temperature detection signal and generating a plurality of fixed delay signals.

4. The temperature sensor of claim 3, wherein the first bias unit comprises:
   a first PMOS transistor having a source connected to a power voltage,
   a first NMOS transistor having a gate and drain connected to a drain of the first PMOS transistor and having a source connected to a ground voltage;
   a second PMOS transistor having a source connected to the power voltage and having interconnected gate and drain;
   a second NMOS transistor having a source connected to the drain of the second PMOS transistor;
   a third NMOS transistor having a drain connected to the drain of the second NMOS transistor, having a gate connected to the gate of the first NMOS transistor to generate the second bias signal, and having a source connected to the ground voltage;
   a third PMOS transistor having a source connected to the power voltage and having a gate connected to the gate of the second PMOS transistor to generate the first bias signal; and
   a fourth NMOS transistor having a gate and drain connected to the drain of the third PMOS transistor and the gate of the second NMOS transistor, and having a source connected to the ground voltage.

5. The temperature sensor of claim 3, wherein one of the delay terminals comprises:
   a first PMOS transistor having a source connected to the power voltage, and having a gate connected to the first bias signal;
   a second PMOS transistor having a source connected to a drain of the first PMOS transistor and having a gate connected to an output signal of a previous delay terminal;
   a first NMOS transistor having a drain connected to a drain of the second PMOS transistor to generate an output signal of the delay terminal, and having a gate connected to the output signal of the previous delay terminal; and
   a second NMOS transistor having a drain connected to the source of the first NMOS transistor, having a gate connected to the second bias signal, and having a source connected to the ground voltage.

6. The temperature sensor of claim 1, wherein the variable delay cell has a delay time that varies in response to temperature.

7. The temperature sensor of claim 6, wherein the variable delay cell comprises:
   a second bias unit operated at a variable amount of internal current according to the change in the temperature and outputting third and fourth bias signals; and
   a plurality of serially connected delay terminals inputting the temperature detection signal to generate a variable delay signal.

8. The temperature sensor of claim 7, wherein the second bias unit comprises:
   a first PMOS transistor having a source connected to the power voltage and having interconnected gate and drain;
   a resistor connecting the drain of the first PMOS transistor and the ground voltage;
   a second PMOS transistor having a source connected to the power voltage and having a gate connected to the gate of the first PMOS transistor to generate the third bias signal; and
   an NMOS transistor having a gate and drain connected to a drain of the second PMOS transistor to generate the fourth bias signal and having a source connected to the ground voltage.

9. The temperature sensor of claim 7, wherein one of the delay terminals comprises:
   a first PMOS transistor having a source connected to the power voltage, and having a gate connected to the third bias signal;
   a second PMOS transistor having a source connected to a drain of the first PMOS transistor and having a gate connected to an output signal of a previous delay terminal;
   a first NMOS transistor having a drain connected to a drain of the second PMOS transistor to generate an output signal of the delay terminal, and having a gate connected to the output signal of the previous delay terminal; and
   a second NMOS transistor having a drain connected to the source of the first NMOS transistor, having a gate connected to the fourth bias signal, and having a source connected to the ground voltage.

10. The temperature sensor of claim 1, wherein the sectional discrimination logic unit discriminates the sectional temperatures based on temperatures where an output of the variable delay cell meets each of outputs of the fixed delay cells according to temperature.

11. The temperature sensor of claim 1, further comprising latch units latching each of the fixed delay signals in response to the variable delay signal.

12. The temperature sensor of claim 11, wherein each of the latch units comprises a D-flipflop that inputs the variable delay signal as a clock signal and the fixed delay signals as data, respectively.

13. A sectional temperature detection method, comprising:
   generating a plurality of fixed delay signals at fixed time intervals in response to a temperature detection signal;
   generating a variable delay signal having a delay time that varies according to temperature in response to the temperature detection signal;
   latching the fixed delay signals in response to the variable delay signal; and
   generating temperature codes in response to the latched fixed delay signals.

14. The sectional temperature detection method of claim 13, further comprising discriminating the sectional temperatures based on temperatures where the variable delay signal meets each of the fixed delay signals.

15. The sectional temperature detection method of claim 14, wherein the temperature codes correspond to the sectional temperatures.

16. The sectional temperature detection method of claim 13, wherein the fixed delay signals are current-mirrored with a bias unit operated at a fixed amount of internal current regardless of the change in the temperature and generated from serially connected inverter chains outputting the temperature detection signal.

17. The sectional temperature detection method of claim 13, wherein the fixed delay signals are current-mirrored with a bias unit operated at a variable amount of internal current according to the change in the temperature and generated from the serially connected inverter chains outputting the temperature detection signal.

18. A temperature sensor comprising:
a plurality of serially connected fixed delay cells structured to delay a temperature detection signal by a fixed amount of time, where the fixed delay cells include:
a first bias unit that generates at least one fixed bias signal, and
a plurality of delay terminals delaying the inputted temperature detection signal in response to the at least one fixed bias signal;
a variable delay cell structured to delay a temperature detection signal as a function of a detected temperature, where the variable delay cell includes:
a second bias unit that generates at least one variable bias signal that varies in response to the detected temperature, and
a plurality of delay terminals delaying the inputted temperature detection signal in response to the at least one variable bias signal;
a plurality of latch units, where each latch unit respectively latches each of the delayed temperature detection signals generated by the fixed delay cells in response to the delayed temperature detection signal from the variable delay cell; and
a sectional discrimination logic unit that inputs the latched temperature detection signals to generate a temperature code signal.

19. The temperature sensor of claim 18, wherein the each of the delay terminals of the fixed delay cells is structured the same as each delay terminal of the variable delay cell.

20. The temperature sensor of claim 18, wherein the first and second bias units each generate two bias signals that are respectively inputted to the delay terminals of the fixed delay cells and the variable delay cells.

* * * * *

UNITED STATES PATENT AND TRADEMARK OFFICE
CERTIFICATE OF CORRECTION

PATENT NO. : 7,534,035 B2  Page 1 of 1
APPLICATION NO. : 11/566664
DATED : May 19, 2009
INVENTOR(S) : Chan-Kyung Kim It is certified that error appears in the above-identified patent and that said Letters Patent is hereby corrected as shown below:

Column 1, line 61, equation 1, the equation "$ID=Is*(e^{VD/VT})=Is*(e^{VD/VT})$" should read -- $ID=Is*(e^{VD/VT}-1)=Is*(e^{VD/VT})$ --;

Column 4, line 47, the word "CDI" should read -- CD1 --;

Column 6, line 35, the word "1001C" should read -- 100°C --;

Column 7, line 29, claim 4 the word "voltage," should read -- voltage; --;

Column 9, line 18 to Column 10, line 24, claim 18 delete claims 18, 19, and 20.

Signed and Sealed this

Eighth Day of December, 2009

David J. Kappos
*Director of the United States Patent and Trademark Office*